United States Patent
Osada et al.

(10) Patent No.: US 6,295,218 B1
(45) Date of Patent: *Sep. 25, 2001

(54) SEMICONDUCTOR DEVICE

(75) Inventors: Kenichi Osada, San Jose, CA (US);
Koichiro Ishibashi, Warabi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/549,230

(22) Filed: Apr. 13, 2000

Related U.S. Application Data

(63) Continuation of application No. 09/219,429, filed on Dec. 23, 1998, now Pat. No. 6,058,038.

(30) Foreign Application Priority Data

Dec. 26, 1997 (JP) .................................................. 9-359274

(51) Int. Cl.$^7$ .................................................. G11C 15/00
(52) U.S. Cl. ........................................ 365/49; 365/189.05
(58) Field of Search ........................ 365/49, 189.05, 365/230.03, 189.06, 189.07

(56) References Cited

U.S. PATENT DOCUMENTS

| | | | |
|---|---|---|---|
| 4,894,799 | 1/1990 | Hanawa et al. | 365/49 |
| 5,396,448 | 3/1995 | Takayanagi et al. | 365/49 |
| 5,475,825 | 12/1995 | Yonezawa et al. | 395/401 |
| 5,500,814 | 3/1996 | Kinoshita et al. | 365/49 |
| 5,548,742 | 8/1996 | Wang et al. | 395/455 |
| 5,617,348 | 4/1997 | Maguire | 365/49 |
| 5,715,188 | 2/1998 | Covino et al. | 365/49 |
| 5,802,554 | 9/1998 | Caceres et al. | 711/103 |
| 5,860,097 | 1/1999 | Johnson et al. | 711/128 |

FOREIGN PATENT DOCUMENTS 275689   5/1996 (TW) .

OTHER PUBLICATIONS

1995 IEEE International Solid–State Circuits Conference, *Digest of Technical Papers*, pp. 174–175, Feb. 1995.

*Primary Examiner*—Son T. Dinh
(74) *Attorney, Agent, or Firm*—Antonelli, Terry, Stout & Kraus, LLP

(57) ABSTRACT

A memory device having a plurality of blocks, each of a plurality of blocks comprising a memory array having a plurality of word lines and a plurality of memory cells connected to the word lines, an associative cell array for outputting a hit signal by comparing a first address inputted thereto with internal data and a decoder circuit for selecting one line by decoding a second address and wherein one of the word lines is selected based on the line selected by the decoder circuit and the hit signal.

8 Claims, 12 Drawing Sheets

SEMICONDUCTOR DEVICE

CROSS-REFERENCE TO RELATED APPLICATION

This application is a continuation application of U.S. Ser. No. 09/219,429, filed Dec. 23, 1998 now U.S. Pat. No. 6,058,038.

BACKGROUND OF THE INVENTION

The present invention relates to semiconductor memory devices, and particularly to a technology effectively applied to a cache memory housed in a data processing device such as a microprocessor and a microcomputer.

Recently, in accordance with an enhancement of a performance of a low-power consumption microprocessor, an enhancement (high-speed and low-power consumption) of a performance of an on-chip cache memory becomes important. In general, methods of comprising a physical address cache may be classified into three methods, i.e., direct map system, full associative system and set associative system. In the recent microprocessor, considering complexity of hardware, hit rate and access time or the like, the set associative system is employed frequently.

With respect to the set associative system, an example of a 2-way set associative system will be described with reference to FIG. 12.

An offset address in the page within a logical address is used to access a cache data array to read two data from the respective ways to the front of the bus. At the same time, a cache tag array is accessed to read out two tags corresponding to the data thus read out and a virtual page number within the logical address is compared with a physical address transformed by a TLB (translation look aside buffer). If the physical address and the tag value agree with each other (hit), then, data of that way is outputted to the bus.

Since a time in which the TLB is accessed and a hit is detected is generally longer than a time required to read out data from the data array, data read out from the data array cannot be outputted to the bus until the hit signal is made definite, thereby resulting in the access time being increased. Further, since two data have to be read out, it is unavoidable that a power consumption increases.

SUMMARY OF THE INVENTION

As a method of solving the above-mentioned problem, there is proposed a method in which a data array is accessed after a way was selected by using a virtual page number. As an example thereof, there is known a circuit (ISSCC Digest of Technical Papers, pp. 174–175, February 1995).

This conventional technology comprises a CAM array (ECAM) having a virtual page number, a CAM array (RCAM) having a physical address and a memory cell array for holding data. When data is read out, one set comprising 8 data (8 ways) is selected by using a page offset address, and further one way is selected by the ECAM. On the basis of the selected result, data is read out by accessing the memory array. At the same time, a value of a corresponding RCAM also is read out and it is checked whether or not the selected way is correct. On the other hand, when data is written, one set is selected, and data is written in the way selected by using the RCAM. That is, this method is a system in which a way is selected in advance by using the logical address and it is verified by using a physical address whether or not the selection is correct.

However, since the RCAM is generally large in bit width and needs a CAM having a bit width at every set, it needs CAM cells of bit width×the number of sets. Accordingly, the existence of the RCAM causes the area to increase and also causes an access time to increase. A general problem encountered with the circuit using the CAM is that, if the data array is not accessed after the way selection (hit determination) by the CAM was completely ended, there is a possibility that erroneous data will be selected. Thus, there are required large timing margins.

That is, in the CAM, a plurality of entries are initially set in the hit state, the comparison is started and other entries are set in the mistake state while leaving one hit entry. After this comparison was ended completely, the hit signal is transmitted to the word driver to activate the word line. If the hit signal had been transmitted to the word driver before the comparison was not ended completely, a plurality of erroneous word lines would be activated. As a result, when the hit signal is transmitted to the word driver after the comparison was ended, there are required large timing margins. Consequently, the access time increases unavoidably.

An outline of representing embodiments disclosed in the present invention will be described in brief as follows:

That is, each way is comprised of a decoder, a word driver, an associative cell array and a memory array. The decoder selects one line by decoding an offset address signal of a logical address. The associative cell array outputs a coincidence signal by comparing a part of virtual page number inputted thereto with data from the associative cell. The word line of the memory array is selected by a logical product of a line selected by the decoder and a way selected by the associative cell array.

In this system, since only one line is activated within one way (WAY), there is then no risk that a plurality of word lines will be simultaneously activated in the same way by mistake. When the word line is activated after the comparison of the associative cell (CAMCELL) was completed, a timing margin is not required. Thus, the access time can be made high in speed as compared with the prior art.

At the same time, it is verified by using a circuit different from the present circuit based on the physical address whether or not the selected way is correct.

DETAILED DESCRIPTION OF THE PREFERRED EMBODIMENT

A semiconductor memory device according to embodiments of the present invention will hereinafter be described with reference to the drawings.

First Embodiment

Figure 1:
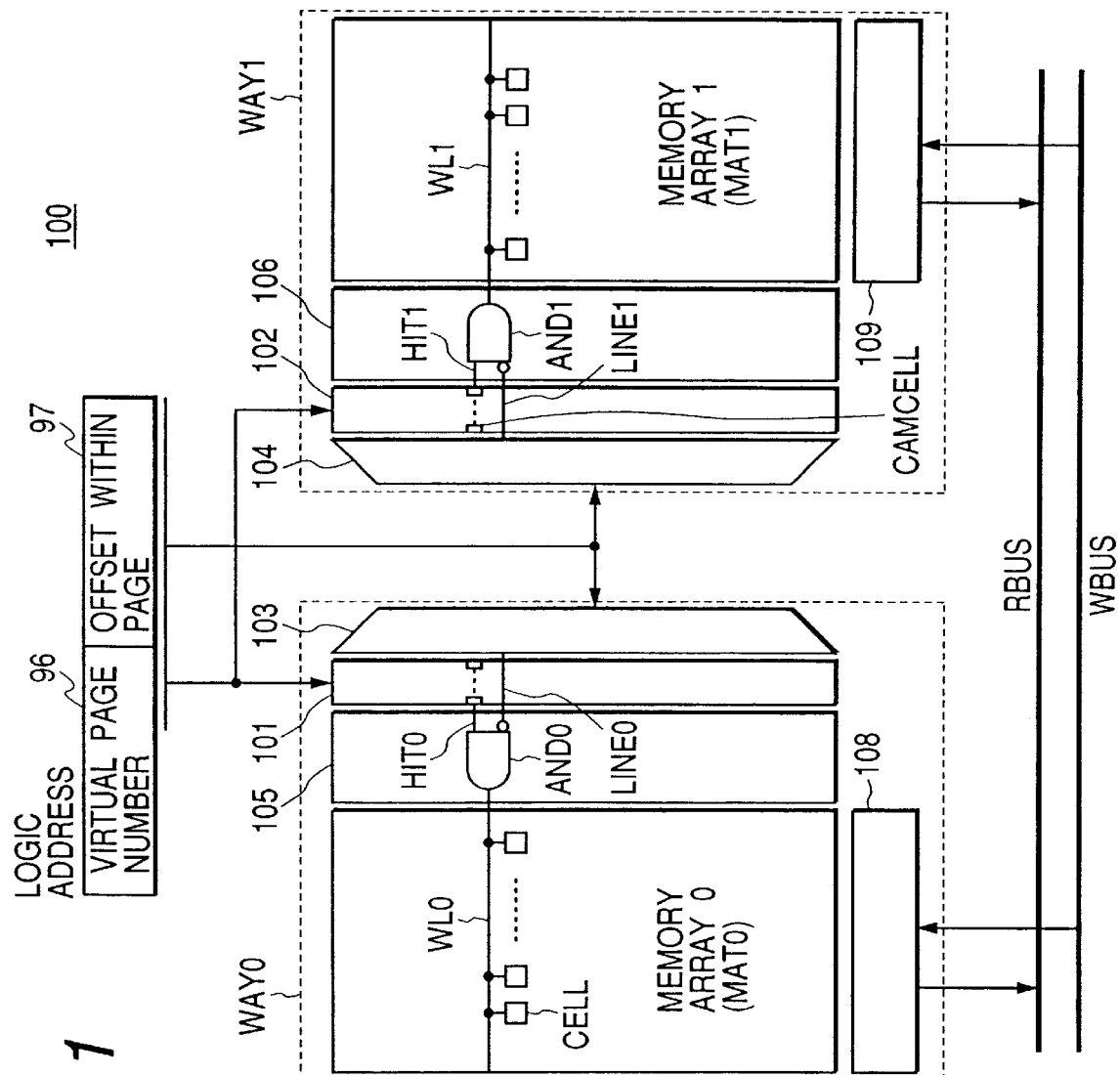
FIG. 1 is a circuit diagram showing a semiconductor memory device according to a first embodiment of the present invention.

FIG. 1 is a circuit diagram showing a semiconductor memory device according to an embodiment of the present invention. A semiconductor device 100 is formed on a semiconductor substrate such as a single crystal silicon by a semiconductor integrated circuit manufacturing technology. A plurality of memory cells CELL and a plurality of associative cells CAMCELL are respectively disposed in a matrix shape (row and column fashion) to thereby arrange memory arrays (MAT) and associative cell arrays (101, 102). There are disposed decoder arrays (103, 104) formed by decoder circuits 98 which select line (LINE) arranged in the column direction and word driver arrays (105, 106) formed by word driver circuits (AND) 99 arranged in the column direction to activate word lines (WL) by a logical product of a hit signal (HIT) and a line signal (LINE). Further, there are disposed sense amplifier and write amplifier arrays (108, 109) formed by a plurality of sense amplifiers and write amplifiers arranged in the row direction, a read data bus RBUS and a write data bus WBUS.

There are disposed two ways (WAY0, WAY1), each way (WAY) being comprised of the memory array (MAT), the associative cell arrays (101, 102), the decoder arrays (103, 104), the word driver arrays (105, 106) and the sense amplifier and write amplifier arrays (108, 109), thereby resulting in the two-way set associative cache data array being formed. When there are disposed n ways (WAY), there is formed n-way set associative cache data array.

An operation of this semiconductor memory device will be described. The decoder circuit 98 decodes the offset address 97 of the logical address to select one line (LINE) per way. A part of virtual page number 96 is inputted to the associative cell arrays (105, 106), in which it is compared with data of the associative cell CAMCELL and thereby the hit signal (HIT) is outputted. The word line of the memory array is selected by the logical product of the line LINE selected by the decoder and the hit signal (HIT) indicative of the selected way (WAY), whereby data is read out from the memory cell CELL and data is written in the memory cell CELL.

Figure 2:
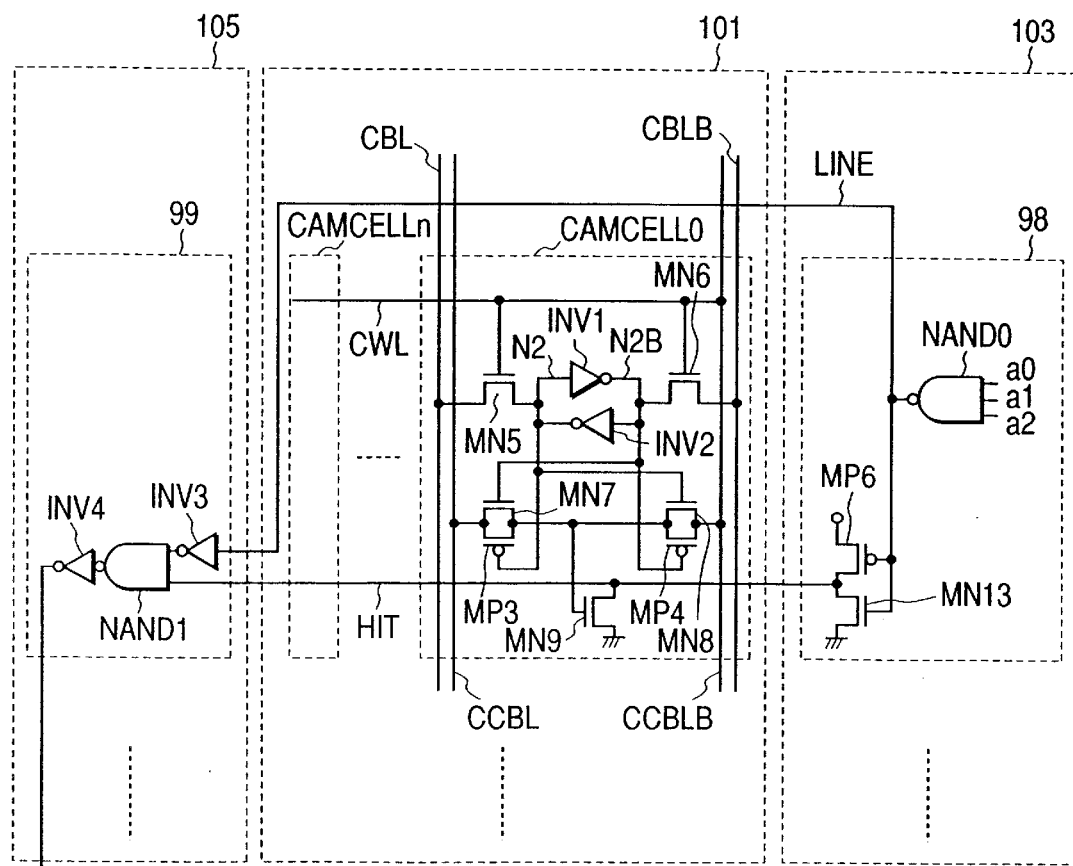
FIG. 2 is a circuit diagram showing the first embodiment more in detail.
Figure 2:
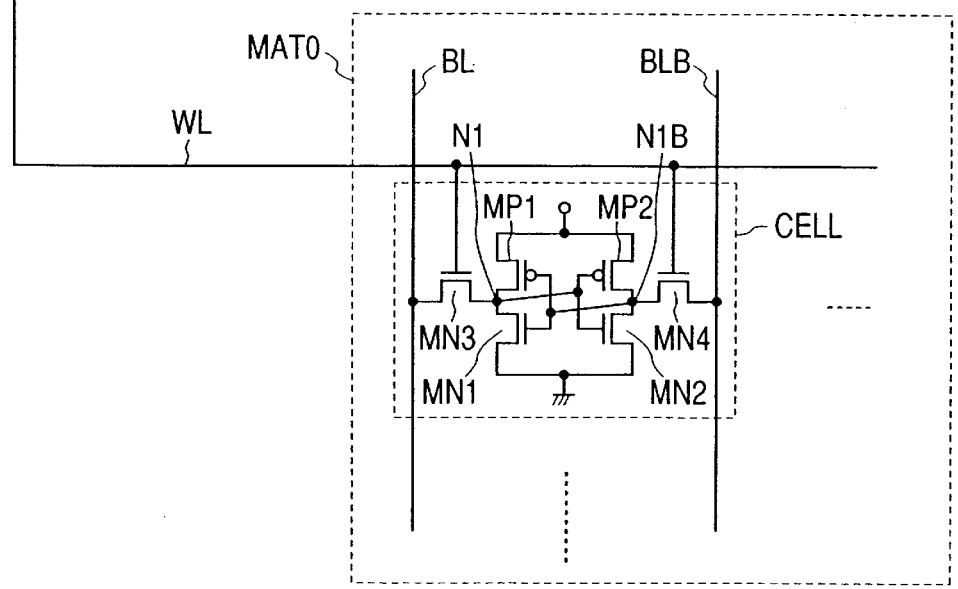

FIG. 2 is a circuit diagram showing more in detail the memory arrays (MAT), the associative cell arrays (101, 102), the decoder arrays (103, 104) and the word driver arrays (105, 106).

The memory cells CELL comprises a flip-flop (comprising P-channel MOS transistors MP1, MP2 and N-channel MOS transistors MN1 and MN2) formed by connecting inputs and outputs of a pair of CMOS inverter circuits and N-channel MOS transistors MN3, MN4 for selectively connecting a node N1 and a node N1B of the above-mentioned flip-flop to bit lines (BL, BLB). The gates of the N-channel MOS transistors MN3, MN4 are connected to a word line WL.

The associative cell CAMCELL comprises flip-flops (INV1, INV2) formed by connecting inputs and outputs of a pair of CMOS inverter circuits, N-channel MOS transistors MN5, MN6 for selectively connecting a node N2 and a node N2B of the above-mentioned flip-flops to bit lines (CBL, CBLB), N-channel MOS transistors (MN7, MN8, MN9) for comparing data accumulated in the nodes N2 and N2B with data of comparison address lines (CCBL, CCBLB) and P-channel MOS transistors (MP3, MP4). A word line CWL is connected to the gates of the N-channel MOS transistors MN5, MN6, and the hit line HIT is connected to the drain of the N-channel MOS transistor MN9, respectively. A value of a virtual page number is stored in the associative cell CAMCELL.

The decoder circuit 98 comprises a NAND circuit NANDO for selecting the line LINE in response to address signals a0, a1, a2 supplied thereto and an inverter circuit (comprising a P-channel MOS transistor MP6 and an N-channel MOS transistor MN13) for activating a comparator portion of the associative cell CAMCELL.

The word driver circuit 99 is a circuit for activating the word line WL by a logical product of a line selection signal LINE of the decoder circuit 98 and the hit signal HIT of the associative cell arrays (101, 102) and is comprised of inverter circuits INV3, INV4 and a NAND circuit NAND1.

In the circuit shown in FIG. 2, the N-channel MOS transistor MN13 and the P-channel MOS transistor MP6 may be replaced with a P-channel MOS transistor whose gate is connected to a ground potential. The inverter circuit INV3 may be removed and the NAND circuit NAND1 may be replaced with an inverter. Further, the P-channel MOS transistors MP3 and MP4 may be removed.

Figure 3:
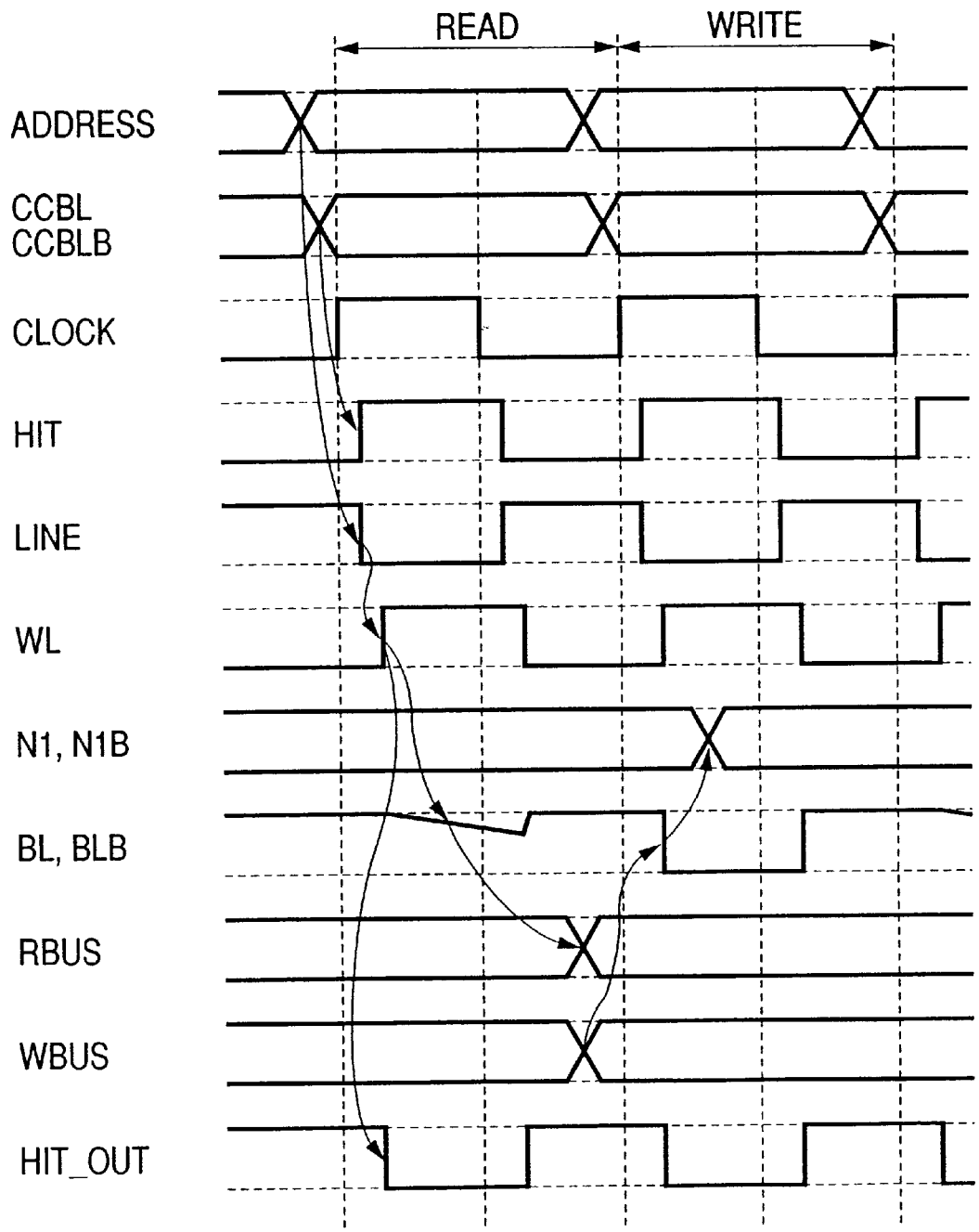
FIG. 3 is a waveform diagram used to explain an operation of the semiconductor memory device according to the first embodiment.

FIG. 3 shows read and write operation waveforms of this embodiment. Before respective operations are started, the bit lines (BL, BLB) of the memory array (MAT) are pre-charged to "H" ("HIGH" level). Before the clock rises, the page offset address 97 is inputted to the decoder circuits (101, 102). Further, several bits of the virtual page number 96 are inputted to comparison address lines (CCBL, CCBLB) and compared with addresses accumulated in the nodes N2 and N2B.

When the clock rises, the decoder circuits (101, 102) always selects one line LINE in each of the ways (WAY0, WAY1) and the selected line LINE goes to "L" ("LOW" level). The comparing circuits in one entry (CAMCELL0 to CAMCELLn) of the associative cell arrays (101, 102) of each way are activated by this signal. If compared results agree with each other, then the hit signal HIT goes to "H". When the hit signal HIT is held at "H" and the line signal LINE goes to "L", the word line WL goes to "H".

When data is read out from the memory cell, electric charges of the pre-charged bit lines (BL, BLB) are discharged by the memory cell CELL, thereby resulting in a potential difference being produced. This potential difference is amplified by the sense amplifiers (108, 109) and then outputted to the read bus RBUS.

When data is written in the memory cell, data of the write bus WBUS is inputted to the bit lines (BL, BLB). When the word line WL goes to "H", data is written in the memory cell CELL.

In this system, since only one line LINE is activated in one way (WAY), only less than one word line WL goes to "H" in one way (WAY), and hence a plurality of word lines within the same memory mat can be prevented from going to "H" by mistake. Therefore, a suitable device such as a logic gate need not be connected between the hit signal HIT and the word driver circuit 99, thereby making the access become high in speed.

Figure 4:
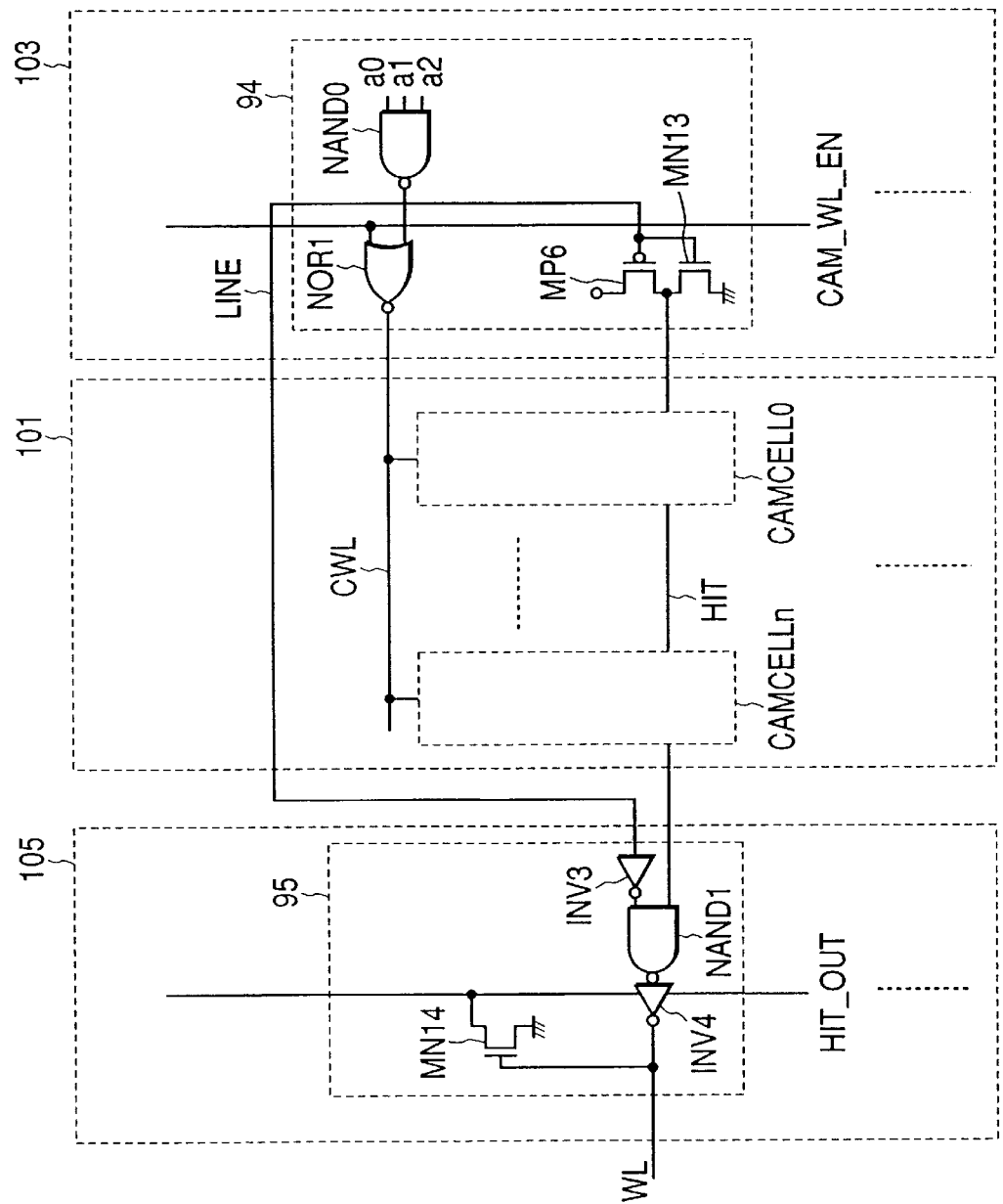
FIG. 4 is a circuit diagram showing the first embodiment more in detail.

FIG. 4 is a diagram showing the circuit of FIG. 2 more in detail. The word driver circuit 99 is replaced with a word driver circuit 95 and the decoder circuit 98 is replaced with a decoder circuit 94. There are added a NOR circuit NOR1 for selecting a word line CWL of an associative cell and an N-channel MOS transistor MN14 for detecting a hit signal from the way. If a signal HIT_OUT is pre-charged in advance, only the HIT_OUT signal of the selected way WAY goes to "L" so that the selected way WAY may be recognized. When data is written in the associative cell CAMCELL, if a signal CAM_WL_EN goes to "H", then an arbitrary address can be directly accessed by using the page offset address.

Alternatively, data may be written in and read out from the memory cell not by using the associative cell CAMCELL but by using only the page offset address 97.

Figure 5:
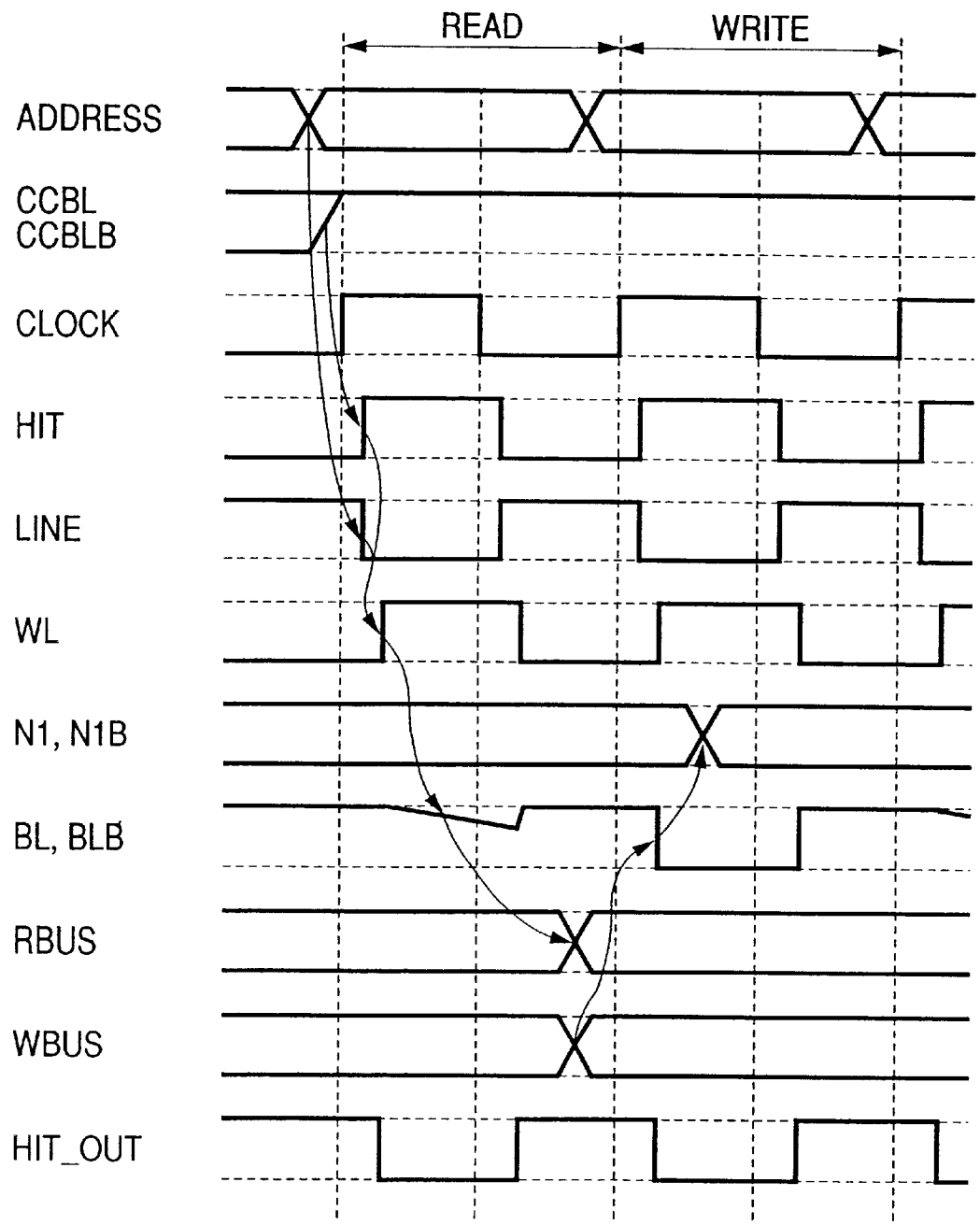
FIG. 5 is a waveform diagram used to explain an operation of the semiconductor memory device according to the first embodiment.

FIG. 5 shows operation waveforms used at that time. Initially, before the clock rises, the page offset address 97 is inputted to the decoder circuits (103, 104). At the same time, the comparison address lines (CCBL, CCBLB) of the accessed way (WAY) are held at "L", and comparison address lines (CCBL, CCBLB) of other way (WAY) are held at "H".

When the clock rises, one line LINE in each of the ways (WAY0, WAY1) is selected by the decoder circuits (101, 102), and held at "L". Since the hit signal HIT of the way (WAY) in which the comparison address lines (CCBL, CCBLB) are held at "L" always goes to "H", the word line WL of the entry in which the line LINE is held at "L" goes to "H". Thus, the writing and reading operations may be executed. With the use of this method, by making the comparison operation of the associative cell CAMCELL invalid, regardless of the value of the associative cell, it is possible to access an arbitrary word of an arbitrary way (WAY).

This method may be executed at exactly the same timing as the timing of the accessing using the associative cell CAMCELL. Further, extra circuits for this operation are not required. According to this method, an associative cell array (RCAM) having a physical address required by the conventional direct access are not required, thereby making it possible to reduce an area and to make the access high in speed.

Second Embodiment

Figure 6:
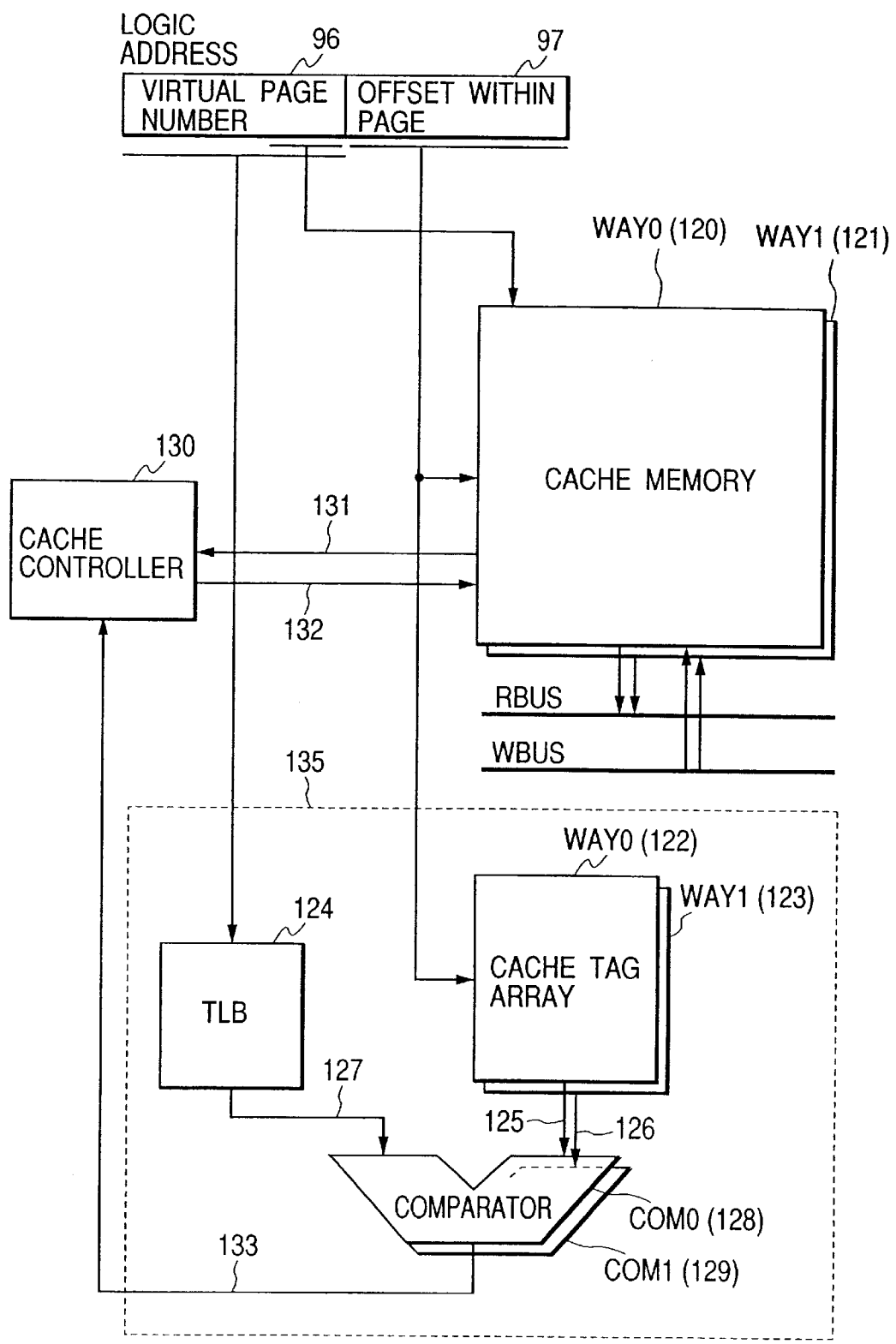
FIG. 6 is a diagram showing a computer system using a cache memory according to a second embodiment of the present invention.

FIG. 6 is a block diagram of a 2-way set associative cache memory in which the semiconductor memory device 100 according to the first embodiment of the present invention is used as a cache memory data array. An outline of an operation is of the system in which a way is selected by using the virtual page number 96, the cache data array is accessed and the selected way is verified by a physical address.

The cache data array is the circuit 100 mentioned in the first embodiment, and is comprised of two ways (120, 121). The associative cell arrays (101, 102) have a 4-bit width and store a value of low-order 4 bits of the virtual page number. A TLB circuit 124 is an address converter for converting the virtual page number 96 into a physical address 127. A cache tag array, comprising a way0 (122) and a way1 (123), receives the page offset address 97 and outputs two physical addresses (125, 126) to a comparator. The comparator is a circuit comprising COM0 (128) and COM1 (129) to detect whether or not the physical address 127 agrees with the physical addresses (125, 126). A cache controller 130 is a circuit for controlling the cache memory.

An operation will be described below. In the ordinary reading, the cache data array receives the page offset address 97 and starts the access. At the same time, the low-order 4 bits of the virtual page number 96 are inputted to the associative cell arrays (101, 102) to thereby select the way. Only the memory array (MAT) of one of the two ways (120, 121) is accessed and data is outputted to the write bus RBUS. Further, at the same time, data indicative of one accessed way of the two ways (120, 121) is transmitted to the cache controller 130 (signal 131). On the other hand, the cache tag array receives the page offset address 97 and outputs one physical address (125, 126) from the respective ways (122, 123) to the comparators (128, 129). The physical address 125 read out from the way0 (122) corresponds to data read out from the way0 (120) of the cache data array. The physical address 126 readout from the way1 (123) corresponds to data read out from the way1 (121) of the cache data array. The comparator COM0 (128) detects whether or not the physical address 127 from the TLB 124 and the physical address 125 from the way0 (122) agree with each other. The comparator COM1 (129) detects whether or not the physical address 127 from the TLB 124 and the physical address 126 from the way1 (123) agree with each other. Data indicative of the way in which the physical addresses are coincident with each other is supplied to the cache controller 130 (signal 133).

If the way indicated by the signal 133 and the way designated by the signal 131 agree with each other, then control goes to the next processing without trouble. However, if the way designated by the signal 133 and the way indicated by the signal 131 do not agree with each other, then in the next cycle, the way which is not accessed by the cache data array should be accessed and data should be outputted to the read bus RBUS.

If the signal 131 designates neither of the two ways to cause "mistake" but the signal 133 designates only one way, then the cache data array accesses the designated way and outputs data to the read bus RBUS.

Further, if the signal 133 designates neither of the two ways, then this is a completely mistake, and hence cache data must be exchanged.

In this method, data of the two ways in the cache data array should be inhibited from being read out simultaneously. To avoid this disadvantage, LRU (least recently used) bit may be added or when data is exchanged, values of associative cell rows activated by the same page offset address 97 may be made different.

To access the way designated by the cache data array may be executed by nullifying the comparison operation of the associative cell CAMCELL as mentioned in the first embodiment.

Since this method accesses data at high speed after the way was selected, this method is effective for making the semiconductor memory device high in speed and low in power consumption.

Figure 13:
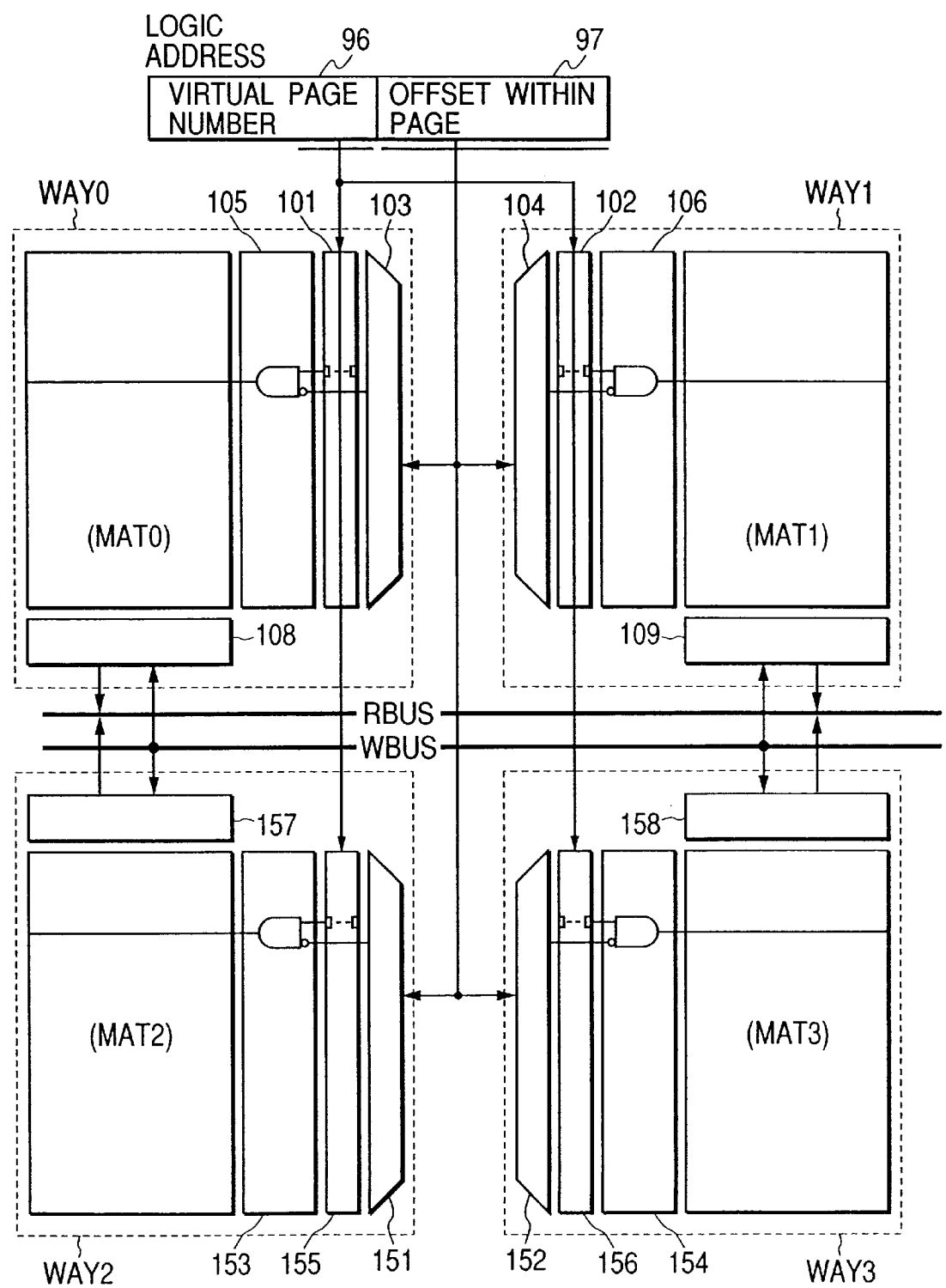
FIG. 13 is a circuit diagram showing a semiconductor memory device according to a second embodiment.

As shown in FIG. 13, the two-way may be modified into 4-way, and further may be modified into 8-way or n-way (n is an integer greater than 2).

Third Embodiment

The manner in which data is read out has been described so far in the second embodiment. However, data cannot be written by the same method. The reason for this is as follows. That is, it is frequently observed that the way is erroneously selected by using the virtual page number 97. If data had been written in the erroneous way, data would not be recovered. Further, there is known a method in which data is written after the way was selected by using the physical address. In general, since it takes one cycle to select the way by using the physical address, two cycles are required to write data, thereby resulting in the performance of the processor being lowered. This problem may be solved by such an arrangement in which a memory mat capable of reading and writing data in one cycle simultaneously is combined with the circuit shown in FIG. 1 and the word driver circuit 99 in the circuit shown in FIG. 1 is modified as shown in FIG. 7.

Initially, an operation will be described schematically. FIG. 8 is a schematic diagram of the writing operation of the circuit diagram of FIG. 7. When a write command is received in the first cycle, its address A is latched, and at the same time, a way in which data is to be written is selected by the hit detecting circuit. In the second cycle, another address B is accessed. Subsequently, data is written in the way selected during the first cycle based on the address A latched in the first cycle. According to this method, since two addresses are accessed during the two cycles, the writing is finished by substantially one cycle. The circuit and the operation will be described in detail below.

Figure 7:
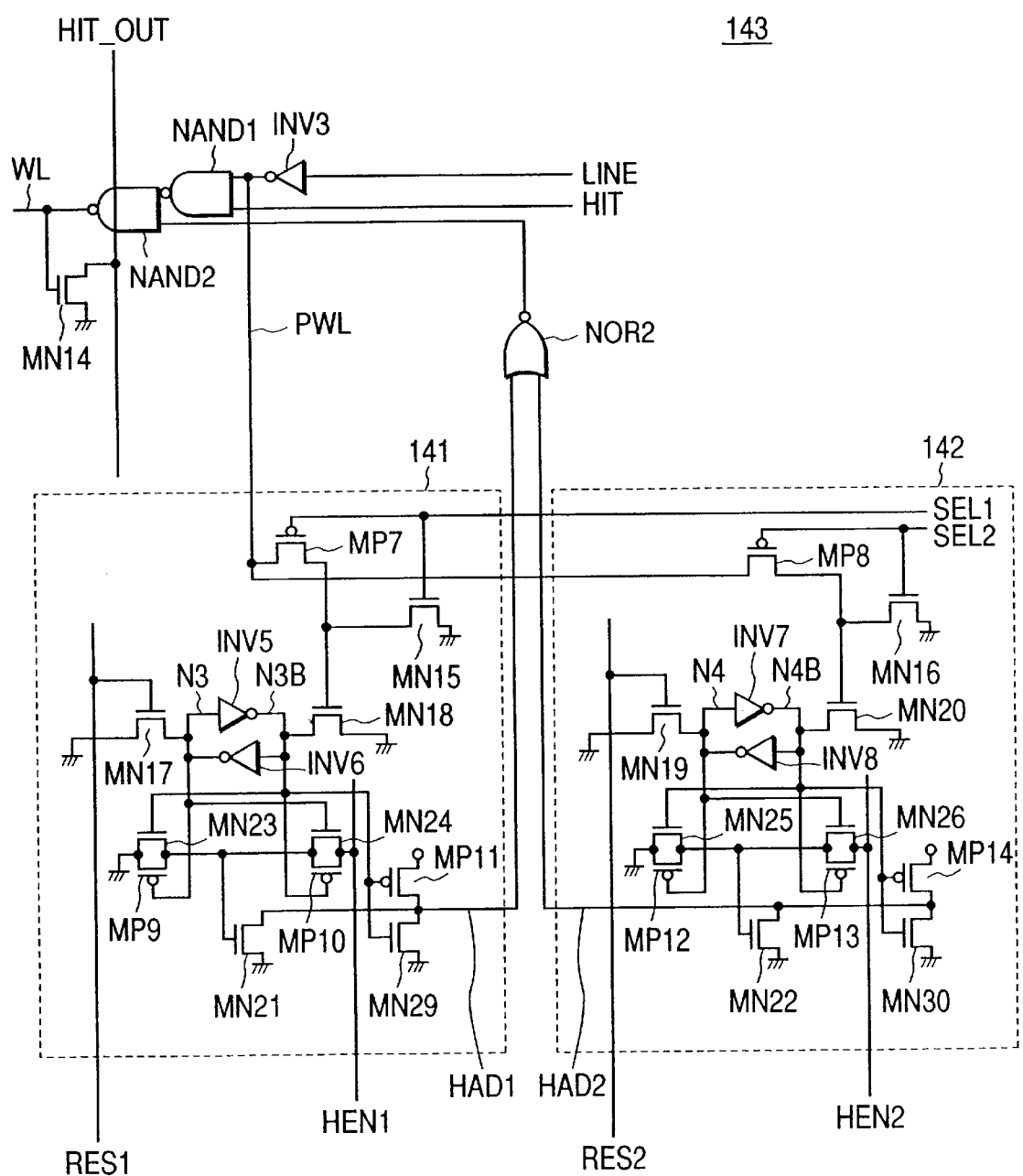
FIG. 7 is a circuit diagram showing a third embodiment more in detail.
Figure 8:
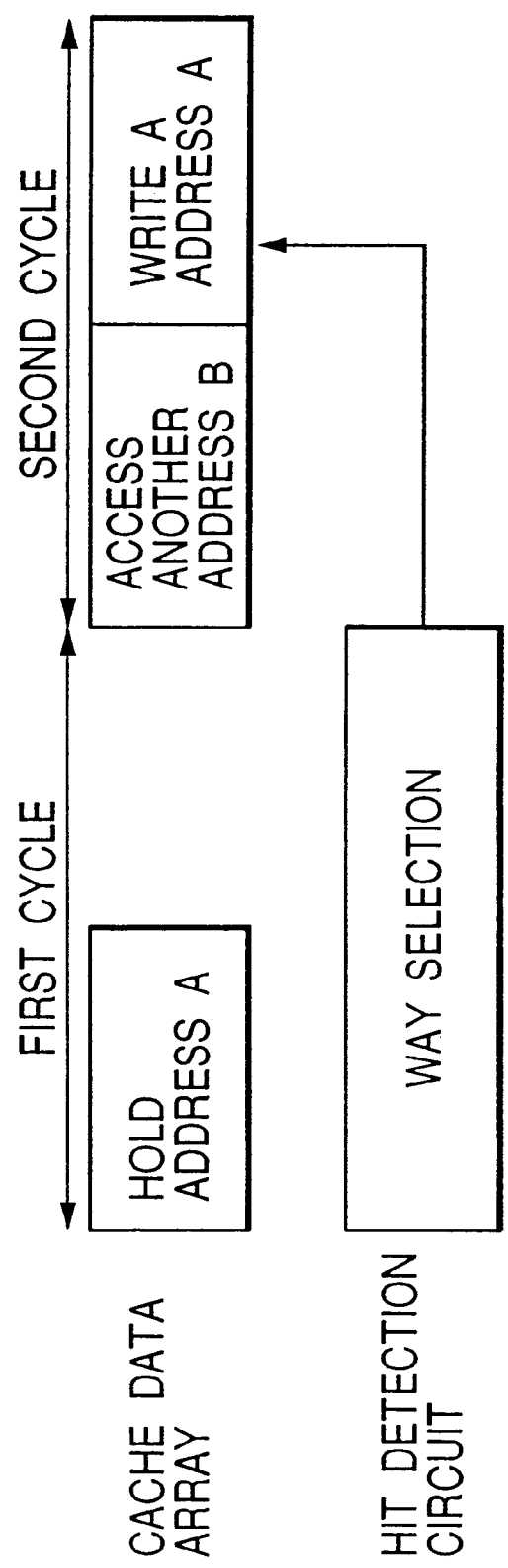
FIG. 8 is a schematic diagram showing an operation of the cache memory according to the third embodiment.

In a word driver 143 shown in FIG. 7, as compared with the word driver circuit 99 shown in FIG. 1, the inverter circuit INV4 is replaced with a NAND circuit NAND2, and a NOR circuit NOR2 and latches (141, 142) are added.

A latch 141 comprises a flip-flop (INV5, INV6) arranged by connecting inputs and outputs of a pair of CMOS inverters, N-channel MOS transistors (MN17, MN18) for selectively connecting nodes N3 and N3B of the above-mentioned flip-flop to a ground potential, transistors (MN23, MN24, MP9, MP10) which are turned on and off by the values of the nodes N3 and N3B, an N-channel MOS transistor MN21 which is turned off when the values of the nodes N3 and N3B are respectively "L" and "H" and which is turned on and off by a value of a signal HEN1 when the nodes N3 and N3 are respectively "H" and "L", a P-channel MOS transistor MP11 and a N-channel MOS transistor MN29 which are turned on and off by the value of the node N3B and transistors (MN15, MP7) for selecting a signal which turns on and off the N-channel MOS transistor MN18. A selection signal SEL1 is connected to the gates of the N-channel MOS transistor MN15 and the P-channel MOS transistor MP7, a signal PWL is connected to the drain of the P-channel MOS transistor MP7, a reset signal RES1 is connected to the gate of the N-channel MOS transistor MN17, and a signal HAD1 is connected to the drains of the N-channel MOS transistors (MN21, MN29) and the P-channel MOS transistor MP11, respectively.

A latch 142 comprises a flip-flop (INV7, INV8) formed by connecting inputs and outputs of a pair of CMOS inverters, N-channel MOS transistors (MN19, MN20) for selectively connecting nodes N4 and N4B of the above-mentioned flip-flop to a ground potential, transistors (MN25, MN26, MP12, MP13) which are controlled by the values of the nodes N4 and N4B, an N-channel MOS transistor MN22 which is turned off when the values of the nodes N4 and N4B are respectively "L" and "H" and which is turned on and off by a value of a signal HEN2 when the values of the nodes N4 and N4 are respectively "H" and "L", a P-channel MOS transistor MP14 and an N-channel MOS transistor MN30 which are turned on and off by the value of the node N4B and transistors (MN16, MP8) for selecting a signal which turns on and off the N-channel MOS transistor MN20. A selection signal SEL2 is connected to the gates of the N-channel MOS transistor MN16 and the P-channel MOS transistor MP8, a signal PWL is connected to the drain of the P-channel MOS transistor MP8, a reset signal RES2 is connected to the gate of the N-channel MOS transistor MN19 and a signal HAD2 is connected to the drains of N-channel MOS transistors (MN22, MN30) and the P-channel MOS transistor MP14.

Figure 9:
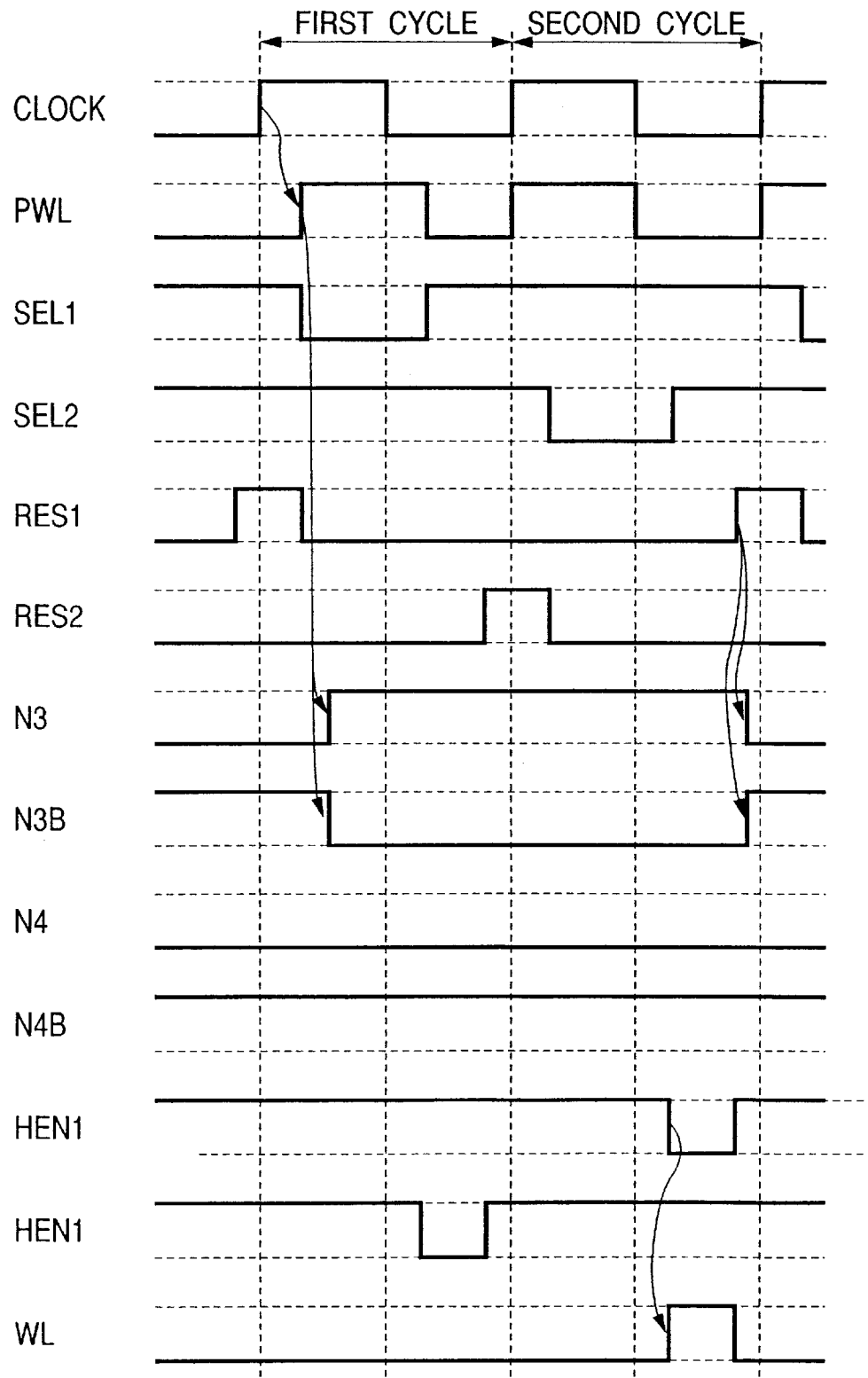
FIG. 9 is a waveform diagram used to explain an operation of the cache memory according to the third embodiment.

FIG. 9 shows the operation waveforms used when a write command is received in the first cycle and data is written in the second half of the second cycle.

Initially, before the start of the first cycle, the reset signal RES1 is held at "H" to reset all the latches 141 so that the node N3 is set to "L" and the node N3B is set to "H". When the clock rises in the first cycle, one line LINE is selected in one way, and the signal PWL goes to "H". At the same time, the latch selection signal SEL1 is held at "L" to turn on the transistor MN18 so that the node N3 is held at "H" and the node N3B is held at "L". Thus, this entry is latched. At the same time, the way is selected in advance by using the physical address as mentioned in the second embodiment.

In the first half of the second cycle, other address is accessed. In the second half thereof, the signal HEN1 of the way selected by the physical address is held at "L", the transistor MN21 is turned off and the signal HAD1 is held at "H", whereby the word line WL is held at "H" to write data.

Figure 10:
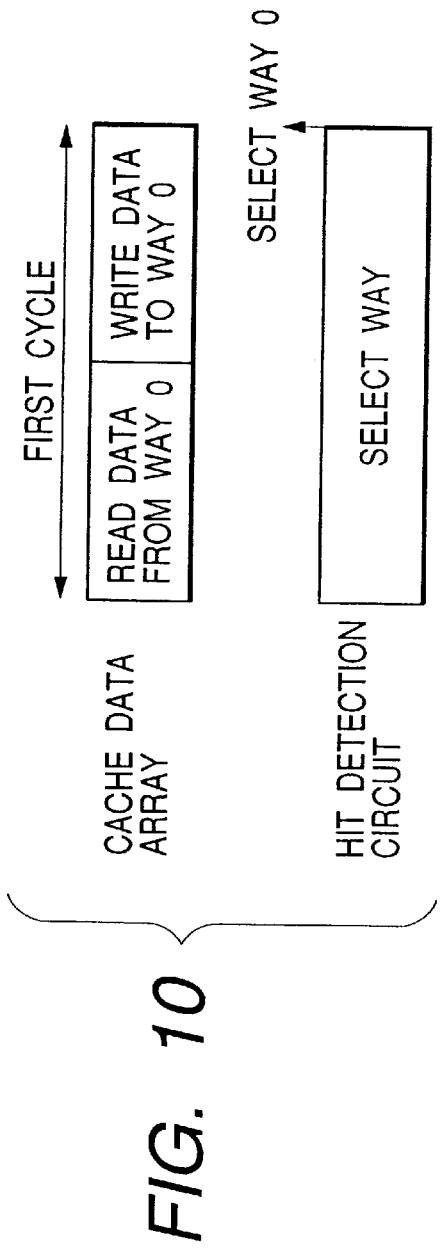
FIG. 10 is a schematic diagram used to explain an operation of the cache memory according to the third embodiment.
Figure 11:
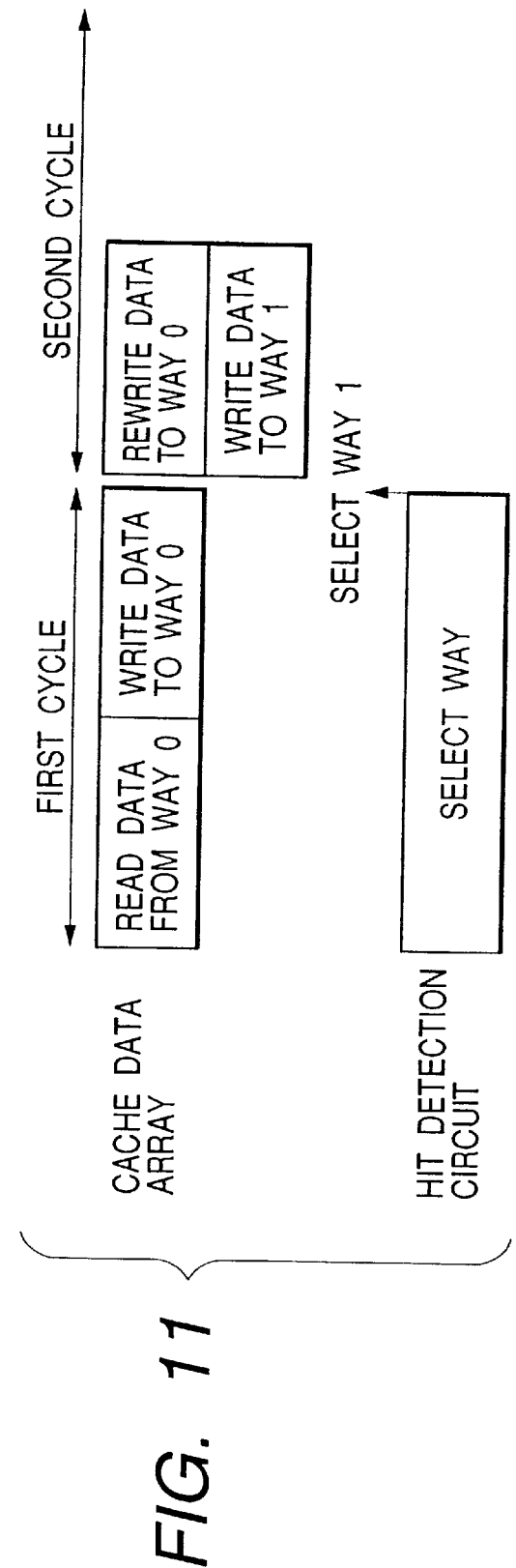
FIG. 11 is a schematic diagram used to explain an operation of the cache memory according to the third embodiment.
Figure 12:
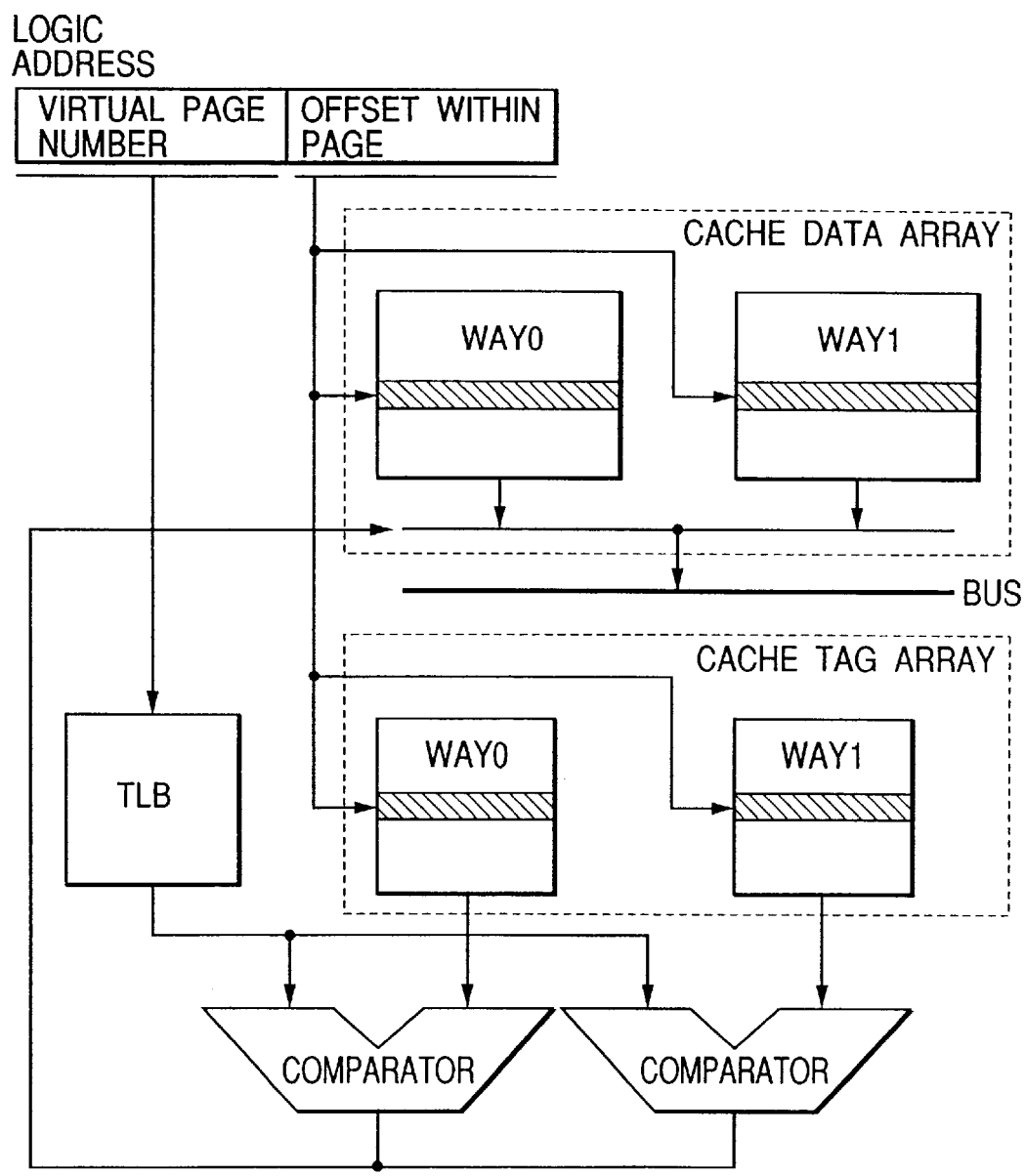
FIG. 12 is a schematic diagram showing a set associative cache according to the prior art.

Further, data may be written during one cycle by the methods shown in FIGS. 10 and 11. That is, initially, data of the way designated by the associative cell CAMCELL is read out and then write data is written during one cycle. If the way selected by the hit detecting circuit and the way in which data is written agree with each other after the end of one cycle, then the writing of data is ended satisfactorily (FIG. 10). If not, then data thus read out is returned and data is written in the way designated by the hit detecting circuit (FIG. 11).

Effects achieved by the representing embodiment of the embodiments of the present invention will be described below in brief.

That is, compared results of the associative cells may be directly transmitted to the word line without timing margin, thereby making the high-speed access become possible.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device having a plurality of blocks, each of said plurality of blocks comprising a memory array having a plurality of word lines and a plurality of memory cells connected to said plurality of word lines, an associative cell array in which a first part of a logic address is inputted, compared with internal data and outputted as a hit signal and a decoder circuit for selecting one line by decoding a second part of the logic address and a word driver for selecting one of said word lines based on a line selected by said decoder circuit and said hit signal.

2. A semiconductor device comprising:
   a memory array including a plurality of word lines;
   an associative cell array including a plurality of hit lines and a plurality of associative cells; and
   a decoder array selecting one of said hit lines and one line in response to an inputted address,
   a word driver for selecting one of said word lines based on said one of said hit lines and said one line.

3. A semiconductor device according to claim 2, wherein said associative cell array stores an address of a bit of a part of a virtual page number.

4. A semiconductor device including a plurality of ways, each of said plurality of ways comprising:
- a memory array including a plurality of word lines;
- a memory array including a plurality of word lines;
- an associative cell array including a plurality of hit lines and a plurality of associative cells; and
- a decoder array selecting one of said hit lines and one line in response to an inputted address,
- a word driver for selecting one of said word lines based on said one of said hit lines and said one line.

5. A semiconductor device according to claim 4, wherein a comparison address line is fixed to a predetermined potential, whereby an arbitrary address of a memory array of an arbitrary way can be accessed by using only an address regardless of data stored in said associative cell.

6. A semiconductor device according to claim 4, wherein said associative cell array stores an address of a bit of a part of a virtual page number.

7. A semiconductor device according to claim 4, wherein data of a plurality of ways can be inhibited from being selected simultaneously under logical control such that data stored in the associative cell array accessed by the same address may not agree with each other in different ways.

8. A semiconductor device according to claim 7, wherein said memory array is accessed after a way was selected by using a part of said virtual page number.

* * * * *